(12) United States Patent
Lin

(10) Patent No.: US 7,273,808 B1
(45) Date of Patent: Sep. 25, 2007

(54) REACTIVE BARRIER/SEED PRECLEAN PROCESS FOR DAMASCENE PROCESS

(75) Inventor: Chingfu Lin, Freemont, CA (US)

(73) Assignee: Novellus Systems, Inc., San Jose, CA (US)

( * ) Notice: Subject to any disclaimer, the term of this patent is extended or adjusted under 35 U.S.C. 154(b) by 656 days.

(21) Appl. No.: 10/356,960

(22) Filed: Feb. 3, 2003

(51) Int. Cl.
*H01L 21/4763* (2006.01)
*H01L 23/52* (2006.01)

(52) U.S. Cl. ............... 438/622; 438/687; 257/E21.577

(58) Field of Classification Search ............... 438/706, 438/710, 711, 714, 720, 722, 618–622, 687; 257/E21.577, E21.585
See application file for complete search history.

(56) References Cited

U.S. PATENT DOCUMENTS

| | | | | |
|---|---|---|---|---|
| 5,434,451 | A | 7/1995 | Dalal et al. ................. | 257/768 |
| 6,130,161 | A | 10/2000 | Ashley et al. ............... | 438/687 |
| 6,207,222 | B1 | 3/2001 | Chen et al. ................... | 427/97 |
| 6,352,938 | B2 * | 3/2002 | Chen et al. ................. | 438/725 |
| 6,355,568 | B1 | 3/2002 | Wang et al. ................. | 438/704 |
| 6,355,571 | B1 | 3/2002 | Huang et al. ............... | 438/706 |

* cited by examiner

*Primary Examiner*—Anh Duy Mai
(74) *Attorney, Agent, or Firm*—DeLio & Peterson, LLC

(57) ABSTRACT

A method for making a multilayer interconnect electronic component structure, and, in particular, an integrated circuit semiconductor device made using a copper damascene method is provided. The process of the invention uses a method for pre-cleaning exposed copper surfaces in the structure. The method employs a cleaning composition containing a nitrogen containing material and an oxygen containing material and also optionally a hydrogen containing material to remove the copper oxide film on copper surfaces in the structure. The preferred nitrogen material is nitrogen gas and the preferred oxygen material is oxygen gas. The gas mixture is preferably energized to form a plasma which is used to contact and remove the copper oxide and clean the structure. A two-step process may be used employing a nitrogen/oxygen mixture and then a hydrogen containing gas mixture such as $Ar/H_2$. It has also been found that the advantages of the method include not only removal of residue and copper oxide from the structure without significant dielectric shift of the dielectric, but also provides enhanced metal adhesion to the treated dielectric as well as surface passivation of the dielectric.

12 Claims, 1 Drawing Sheet

REACTIVE BARRIER/SEED PRECLEAN PROCESS FOR DAMASCENE PROCESS

BACKGROUND OF THE INVENTION

1. Field of the Invention

This invention relates to the making of electronic components such as integrated circuit semiconductor devices having electrical interconnection structures within the component and, more particularly, to a reactive barrier/seed pre-cleaning method for a dual damascene copper process.

2. Description of Related Art

Multi-layer electronic components offer an attractive packaging solution for high performance systems such as in computer, telecommunications, military, and consumer applications. These electronic components offer high-density interconnections and the ability to provide increased circuitry for a given electronic component size. For convenience, the following description will be directed to a dual damascene fabrication process for making integrated circuit components.

In general, multilayer electronic components made using a damascene or dual damascene process comprise multiple layers of a dielectric material having vias, trenches and other openings in the dielectric layer extending from one layer to another layer. These openings are filled with a conductive material and electrically connect the metallization in one layer to the metallization in another layer and provide for the high density electronic components devices now used in industry.

An important aspect of dual damascene multilayer electronic components are vias or openings between layers in which a conductive material is filled to provide electrical contact between the metallization in the different layers. Broadly stated, the typical multilayer electronic component is built up from a number of layers of a dielectric material layer such as silicon dioxide, fluorinated silicon oxide, polymers including polyimide and fluorinated polyimide, ceramics, carbon and other such dielectric materials. In the processing sequence known in the art as the "Damascene Process", the dielectric layer is patterned using known techniques such as the use of a photoresist material which is exposed to define the wiring pattern. After developing, the photoresist acts as a mask through which a pattern of the dielectric material is removed by a subtractive etch process such as plasma etching or reactive ion etching. Using the Damascene Process, openings defining wiring patterns are provided in the dielectric layer, extending from one surface of the dielectric layer to the other surface of the dielectric layer. These wiring patterns are then filled with a metal using a filling technique such as electroplating, electroless plating, chemical vapor deposition, physical vapor deposition or a combination of methods. This process may include planarization of the metal by removing excess material with a method such as chemical mechanical polishing.

In the Single Damascene Process, vias or openings are provided in the dielectric layer and filled with metallization to provide electrical contact between layers of wiring levels. In the Dual Damascene Process, the via openings and the wiring pattern openings are both provided in the same dielectric layer before filling with metallization. This process simplifies the procedure and eliminates some internal interfaces. These procedures are continued for each layer in the electronic component until the multilayer electronic component is completed.

In FIG. 1, a dual Damascene line and interconnection of the prior art is shown. A substrate 11 has a dielectric layer 12 thereon with a copper layer 13 formed therein. Another dielectric layer 14 is formed on the dielectric layer 12 and a portion removed by etching to form a via opening 15 and a trench opening 16. The via opening 15 and trench opening 16 together form a dual damascene opening for exposing part of the copper layer 13 and for interconnecting with the copper layer.

The dielectric material used to form the layers provides electrical insulation and electrical isolation between the copper wiring elements. To avoid metal diffusion between the copper wiring elements and the dielectric, barrier layers, also referred to as liners, are included in the structure to contain the copper or other metal and to provide improved adhesion of the copper lines and vias to the dielectric or other metallization.

The barrier layer is typically a refractory metal such as Ta or TaN and presents a barrier to the diffusion of copper metal between the via and trench and the dielectric but also presents a barrier between the copper metal and the metallization of the underlying or overlying conductor wiring levels. Typically, the barrier layer is formed in the via and trench on both sidewalls and at the base of the via to form the barrier layer.

In a damascene process, it is always necessary to provide a pre-clean process prior to barrier layer and/or metal deposition of the via and/or via/trench interconnection. As shown in FIG. 1, copper oxides always form at the bottom of a damascene via and/or via/trench because of the opening to the underlying copper layer which exposed copper oxidizes in air. As shown in FIG. 1, a copper oxide film 18 is formed on the surface of the copper conductor layer 13 in dielectric layer 12. Copper oxide is detrimental to the integrated circuit (IC) device and must be removed before further processing.

Etching and stripping cleaning processes may leave residues and a conventional pre-clean process uses argon to sputter the bottom to remove residue and copper oxides. The use of argon however, has a tendency to resputter copper onto the damascene sidewall which causes copper out-diffusion into the dielectric layers. Furthermore, argon has been found to damage the insulation effect of the dielectric especially when low-k materials are used.

Bearing in mind the problems and deficiencies of the prior art, it is therefore an object of the present invention to provide a method for cleaning exposed copper surfaces when making electronic devices and, in particular, when using a single Damascene process or a dual Damascene process.

Another aspect of the invention is to provide electronic components made using the method of the invention.

Still other objects and advantages of the invention will in part be obvious and will in part be apparent from the specification.

SUMMARY OF THE INVENTION

The above and other objects, which will be apparent to those skilled in art, are achieved in the present invention which relates in one aspect to a method for cleaning exposed copper surfaces in a process for making electronic components such as integrated circuit devices comprising the steps of:

providing an integrated circuit structure which is in the process of being fabricated into a finished electronic component using a process such as a damascene process having an exposed copper surface at the base of a via or via/trench interconnect opening;

contacting the exposed copper surface with a composition comprising a nitrogen containing material and an oxygen containing material to clean the copper surface; and continuing the process for making the integrated circuit device.

In a further aspect of the invention a two-step cleaning process may be used wherein after the nitrogen/oxygen cleaning step, a hydrogen containing composition, such as Ar/$H_2$ can be used to provide an additional cleaning effect.

In another aspect of the present invention a method is provided for cleaning exposed copper surfaces in a process for making electronic components such as integrated circuit devices comprising the steps of:

providing an integrated circuit structure which is in the process of being fabricated into a finished electronic component using a process such as a damascene process having an exposed copper surface at the base of a via or via/trench interconnect opening;

contacting the exposed copper surface with a composition comprising a nitrogen containing material, an oxygen containing material, and a hydrogen containing material to clean the copper surface; and continuing the process for making the integrated circuit device.

In another aspect of the invention the nitrogen containing material is nitrogen, ammonia or mixtures thereof. The oxygen containing material is oxygen or an oxygen compound such as a sulfate, sulfite, sulfur dioxide and the like. The hydrogen containing material is hydrogen, $H_2O$ and $NH_3$.

In a further aspect of the invention the composition comprising the nitrogen containing material and oxygen containing material is gaseous and the composition comprising the nitrogen, oxygen and hydrogen materials is gaseous and are both energized using conventional means such as inductive coupled power (ICP) and microwaves to form a plasma.

In still another aspect of the invention, integrated circuit devices are provided which are made using the above pre-cleaning method of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
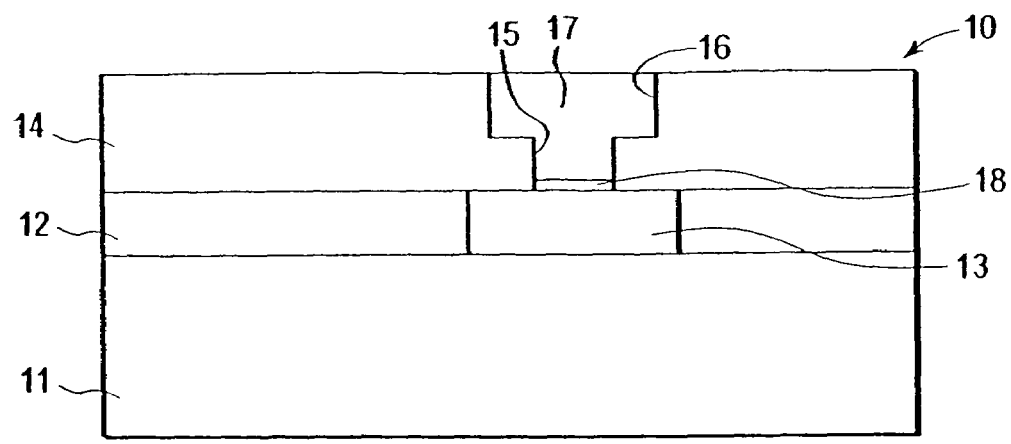
FIG. 1 is a partial cross-sectional elevational view of an integrated circuit device having a dual damascene interconnect to a copper layer in a lower adjacent dielectric layer.

In describing the preferred embodiments of the present invention, reference will be made herein to FIGS. 1-3 of the drawings in which like numerals refer to like features of the invention.

As described above, FIG. 1 shows an integrated circuit device 10 having a dual damascene interconnect. Substrate 11 has a dielectric layer 12 thereon containing a copper layer 13 formed therein. Dielectric layer 14, which overlays dielectric layer 12, has a dual damascene interconnect having a via opening 15 and a connecting trench opening 16. A copper oxide layer 18 is shown formed on the surface of copper layer 13.

The copper oxide 18 layer shown in FIG. 1 is the problem to which this invention is addressed and it is the purpose of the method of the invention to clean the integrated circuit device 10 to remove the copper oxide layer 18 and other debris which may be on the copper oxide layer before proceeding with the IC fabrication process.

Figure 2:
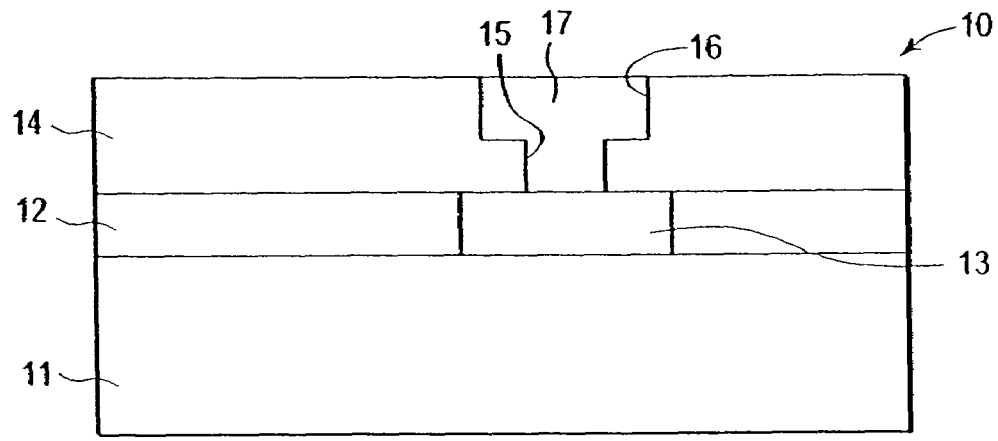
FIG. 2 is a partial cross-sectional elevational view of the integrated circuit device of FIG. 1 shown after the cleaning process of the invention which removed the copper oxide layer on the copper interconnect layer.

Referring now to FIG. 2, the integrated circuit device of FIG. 1 is shown cleaned using the method of the invention to remove the copper oxide layer 18.

Figure 3:
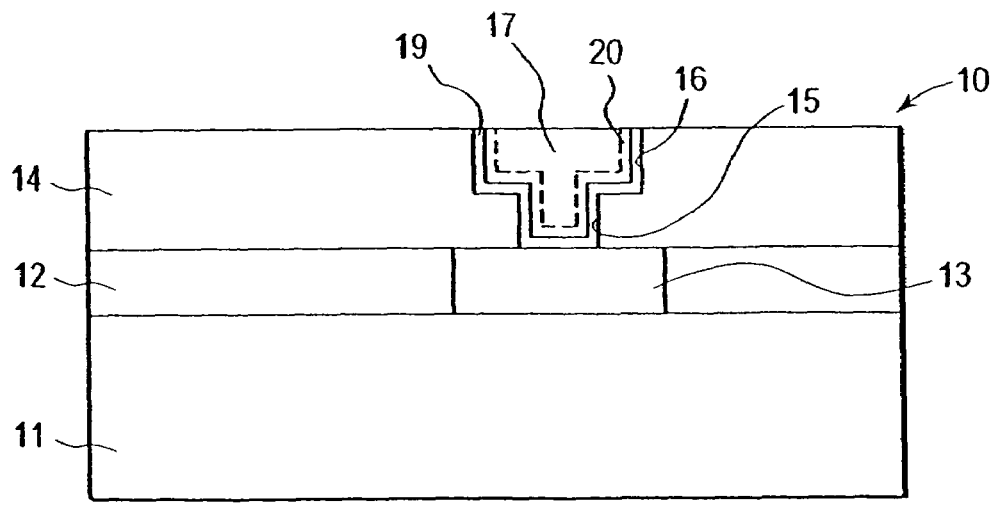
FIG. 3 is a partial cross-sectional elevational view of the integrated circuit device of FIG. 2 showing the via/trench interconnect having a barrier layer and filled with a copper conductor.

FIG. 3 shows the next conventional fabrication step of forming a barrier layer (liner) 19 on the sidewalls of via opening 15 and trench opening 16. The barrier layer containing interconnect is then filled with copper 17 using conventional means. Typically, a seed layer of copper 20 is deposited on the barrier layer walls followed by electrodeposition or other means to fill the interconnect opening with copper.

The liner 19 may be any suitable material which provides a diffusion barrier between the trench and/or via metallization and the dielectric. Preferred liner materials are the refractory metals such as tantalum, tungsten, tantalum nitride, tungsten nitride, silicon nitride, tantalum silicon nitride, tungsten silicon nitride, titanium nitride and titanium silicon nitride. Tantalum containing materials are preferred. The thickness of the liner is usually 2 nm to 100 nm and the liner may be applied using conventional techniques such as sputtering and chemical vapor deposition.

A copper seed layer 20 is then usually applied using known techniques such as flash plating, physical vapor deposition, chemical vapor deposition or electroless plating and covers the surface of the dielectric 14 and barrier layer 19. A copper layer 17 is then electroplated as shown in FIG. 3 filling trench 16 and via 15. Copper 24 may also be deposited by chemical vapor deposition, physical vapor deposition, electroless plating or any suitable method. For some methods such as electroless plating, a separate copper seed layer is generally not needed. The copper layer 17 is then planarized to the surface of dielectric layer 14 using CMP forming the finished via 15 and trench 16 as shown in FIG. 3.

The method of the invention to clean copper oxide films on exposed copper surfaces in a damascene process utilizes a combination of nitrogen and oxygen and an optional further step using a hydrogen containing composition such as Ar/$H_2$, $N_2$/$H_2$ and $NH_3$ in a two-step process. The method also may use a combination of nitrogen, oxygen and hydrogen in a one-step cleaning process. The method has also been found to enhance the metal adhesion to the copper and dielectric surfaces as well as to also passivate the surface. It is a further important advantage of the method of the invention that surface damage to the dielectric is reduced as shown in the example below wherein a reduction in the change in dielectric constant shift of a low-k film is demonstrated versus the conventional argon cleaning method. A lower dielectric constant shift indicates that the damage to the surface caused by the method of the invention is less than conventional clean processes which have a much higher k-shift.

While liquid nitrogen, oxygen and hydrogen materials can be used in the composition of the invention to remove the copper oxide film on exposed copper surfaces in a damascene or other electronic fabrication process, it is preferred that materials be used which are gaseous or which may be formed in gases. It is also further preferred that the gaseous materials be energized to form a plasma typically by heating.

The preferred gaseous nitrogen materials are nitrogen and ammonia. Other nitrogen materials include $NF_3$. The preferred oxygen containing materials are oxygen and sulfur oxide compounds such as SO2. Other oxygen materials include $O_3$, $H_2O$ and $CO_2$. Materials containing both nitrogen and oxygen oxide may also be used such as $NO_x$ where x is 0.5-2.

In one method of the invention argon and/or bias plasma may be used with the nitrogen and oxygen composition and nitrogen, oxygen, hydrogen composition to remove the copper oxide and other residue in a one-step process. Exemplary hydrogen materials are $H_2$, $NH_3$ and $H_2O$.

In another method of the invention a second step may be used wherein a hydrogen based and/or argon based material is used to remove copper oxides after the integrated circuit device has been pre-cleaned with the nitrogen and oxygen containing material composition.

The amounts of the materials used to form the cleaning compositions may vary widely and will typically be about 5:1 to 1:5 volume percent, or higher, for a two component mixture (e.g., $N_2$ and $O_2$), preferably 1:1. For a three component mixture (e.g., $N_2$, $O_2$ and $H_2$) the amounts will be about 5:1:1 to 1:5:1 to 1:1:5 volume percent, or higher, preferably 1:1:1.

The various embodiments of the present invention will now be illustrated by reference to the following specific examples. It should be understood, however, that such examples are presented for purposes of illustration only, and the present invention is no way to be deemed as limited thereby.

EXAMPLE

The following example shows the effect on the k-shift of a low-k dielectric material when using the method of the invention as compared to conventional prior art methods.

In the table below, the use of energized nitrogen gas and oxygen gas in combination is shown to clean a dual damascene interconnect as shown in FIG. 1 and is compared with the prior art methods using argon and argon/hydrogen. The dielectric material is silicon dioxide. All the treatments shown in the table were effective to remove the copper oxide layer but, as noted in the table, the method of the invention had a significantly lower k-shift for a low-k dielectric material than the conventional process. The method of the invention is therefore a significant improvement over the method of the prior art using argon and a combination of argon and hydrogen.

A plasma device was used to energize the compositions and the power source was inductive coupled low frequency power.

TABLE 1

| Source Power | Temp (° C.) | Ar/N2 flow rate (SCFM) | | H2/O2 flow rate (SCFM) | | low-k k-shift |
|---|---|---|---|---|---|---|
| | | Ar | N2 | H2 | O2 | |
| 600 | 30 | 0 | 5 | 0 | 5 | 0.16 |
| 450 | 30 | 0 | 30 | 0 | 30 | 0.13 |
| 300 | 30 | 0 | 15 | 0 | 15 | 0.13 |
| 600 | 30 | 10 | | | | 0.22 |
| 500 | 30 | 15 | | 5 | | 0.24 |

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method for cleaning exposed copper surfaces in a process for making electronic components consisting essentially of the steps of:
   providing an integrated circuit structure which is in the process of being fabricated into a finished electronic component by etching a dielectric layer of the component with an etchant to form an opening having an exposed copper surface with copper oxide on the surface thereof;
   contacting the exposed copper surface of the opening of the etched component with a cleaning composition different from the etchant consisting essentially of a nitrogen containing material and an oxygen containing material to clean the copper surface with a lower dielectric constant shift of the dielectric compared to a conventional argon cleaning method;
   forming a barrier layer on sidewalls and the exposed copper surface in the cleaned opening;
   filling the opening with copper; and
   continuing the process for making the integrated circuit device.

2. The method of claim 1 wherein the exposed copper surface is at the base of a via or via/trench interconnect in a Damascene process.

3. The method of claim 2 wherein the nitrogen containing material is nitrogen and the oxygen containing material is oxygen.

4. The method of claim 3 wherein after the contacting step, the structure is contacted with a hydrogen material containing composition.

5. The method of claim 1 wherein the nitrogen containing material is nitrogen, ammonia or mixtures thereof.

6. Then method of claim 1 wherein the oxygen containing material is selected from the group consisting of oxygen, $O_3$, $H_2O$, $CO_2$, an oxygen containing compound, and mixtures thereof.

7. A method for cleaning exposed copper surfaces in a process for making electronic components consisting essentially of the steps of:
   providing an integrated circuit structure which is in the process of being fabricated into a finished electronic component by etching a dielectric layer of the component with an etchant to form an exposed copper surface at the base of a via or via/trench interconnect opening with copper oxide on the surface thereof;

contacting the exposed copper surface of the opening of the etched component with a cleaning composition different from the etchant consisting essentially of a nitrogen containing material, an oxygen containing material, and a hydrogen containing material to clean the copper surface with a lower dielectric constant shift of the dielectric compared to a conventional argon cleaning method;

forming a barrier layer on sidewalls and the exposed copper surface in the cleaned opening;

filling the opening with copper; and continuing the process for making the integrated circuit device.

8. The method of claim 7 wherein the exposed copper surface is at the base of a via or via/trench interconnect in a Damascene process.

9. The method of claim 8 wherein the nitrogen containing material is nitrogen, the oxygen containing material is oxygen and the hydrogen containing material is hydrogen.

10. The method of claim 7 wherein the nitrogen containing material is nitrogen, ammonia or mixtures thereof.

11. The method of claim 7 wherein the oxygen containing material is selected from the group consisting of oxygen, $O_3$, $H_2O$, $CO_2$, an oxygen containing compound and mixtures thereof.

12. The method of claim 7 wherein the hydrogen containing material is selected from the group consisting of $H_2$, $NH_3$, $H_2O$ and mixtures thereof.

* * * * *